Figure 1:
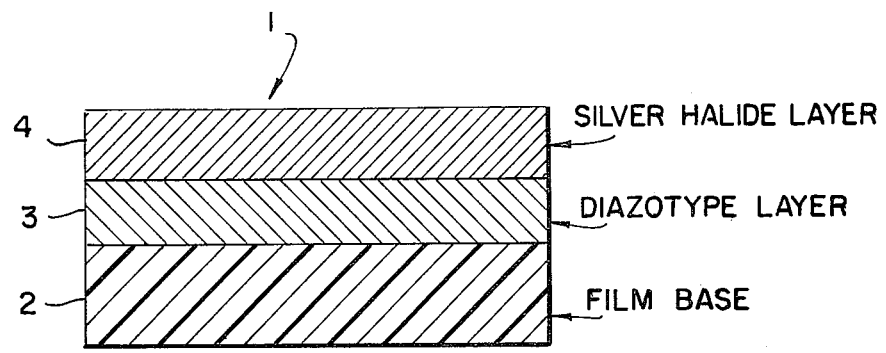

United States Patent [19]

Loprest

[11] 4,256,825

[45] Mar. 17, 1981

[54] PHOTOGRAPHIC ELEMENT AND PHOTOGRAPHIC RECORD PREPARED THEREFROM

[75] Inventor: Frank J. Loprest, Binghamton, N.Y.

[73] Assignee: GAF Corporation, New York, N.Y.

[21] Appl. No.: 46,869

[22] Filed: Jun. 8, 1979

Related U.S. Application Data

[63] Continuation of Ser. No. 686,538, May 14, 1976, abandoned.

[51] Int. Cl.$^3$ .......................... G03C 1/58; G03C 1/76
[52] U.S. Cl. ..................................... 430/142; 430/146; 430/156; 430/394; 430/503; 430/967
[58] Field of Search ............... 430/156, 142, 273, 147, 430/502, 146, 503, 966, 967, 394, 291, 144

[56] References Cited

U.S. PATENT DOCUMENTS

| | | | |
|---|---|---|---|
| 3,245,793 | 4/1966 | Smith | 96/68 |
| 3,313,626 | 4/1967 | Whitney | 96/33 |
| 3,442,648 | 5/1969 | Smith | 96/44 |
| 3,511,658 | 5/1970 | Manko | 96/68 |
| 3,844,789 | 10/1974 | Bates | 96/68 |
| 3,945,822 | 3/1976 | Verhille | 96/68 |

FOREIGN PATENT DOCUMENTS

| | | | |
|---|---|---|---|
| 2517711 | 4/1976 | Fed. Rep. of Germany | 96/68 |
| 1204496 | 9/1970 | United Kingdom | 96/68 |
| 1228591 | 4/1971 | United Kingdom | 430/302 |
| 1445829 | 8/1976 | United Kingdom | 96/68 |

*Primary Examiner*—Mary F. Downey
*Attorney, Agent, or Firm*—James Magee, Jr.; Walter C. Kehm

[57] ABSTRACT

A photographic element, comprising a photographic base carrying a light-sensitive photographic silver halide emulsion layer and a photosensitive non-silver halide layer in operative association with said silver halide layer, said non-silver halide layer containing a light-sensitive composition selected from the group consisting of diazotype compositions, vesicular compositions and photosensitive polymers.

4 Claims, 3 Drawing Figures

PHOTOGRAPHIC ELEMENT AND PHOTOGRAPHIC RECORD PREPARED THEREFROM

This is a continuation of application Ser. No. 686,538, filed May 14, 1976.

The present invention relates to a composite photographic reproduction material for use in industrial and scientific photography, in artistic displays and in radiography.

Conventional photographic products usually carry a photographic silver halide emulsion coating on one side of a transparent or reflecting base material. In radiography, most conventional X-ray films carry such a layer on both sides of a transparent film base. In view of the high cost of silver, a need exists to reduce the amount of silver required for obtaining the desired photographic properties in photographic products without loss of image density, image quality and information content.

It is thus an object of the invention to provide a photographic recording material carrying a light-sensitive silver halide emulsion with a considerably reduced amount of silver halide as compared to that of conventional products used in the areas mentioned above, in combination with a second light-sensitive layer which will yield photographic records of acceptable information capacity.

This and other objects of the invention to be hereafter described as fulfilled by the present invention which provides a transparent film base carrying a light-sensitive photographic silver halide emulsion layer of considerably reduced amount of silver halide, and a non-silver halide, positive or negative-working photosensitive layer whose photosensitive, chemical and physical characteristics are substantially unaffected by the imagewise exposure and development of said silver halide layer, said non-silver halide layer containing a light-sensitive composition selected from the group consisting of diazotype compositions, vesicular compositions and photosensitive polymers.

In use, the silver halide emulsion layer is exposed, developed, stabilized or fixed in a conventional manner to produce a silver image. Following this development, the non-silver halide photosensitive layer is exposed to suitable actinic radiation through the developed silver image. Then the latent image in the thus exposed non-silver halide layer is developed to form a non-silver image. The silver and non-silver image combine in a composite image in various ways and for various applications, as will be described below.

U.S. Pat. Nos. 3,567,445 and 3,578,451 have proposed for use as lithographic plates, a lithographic base carrying a negative working photosensitive composition that undergoes a chemical reaction in imagewise exposed areas which renders the exposed areas organophilic and hydrophobic and a silver halide layer over the negative working photosensitive composition. After formation of a silver image in the silver halide layer, the photosensitive composition is exposed and the silver image is removed prior to development of the photosensitive layer. In this application, the silver image represents a kind of mask for producing a lithographic pattern. The mask is removed after exposure of the underlying photoresist and, therefore, does not contribute to the final image as required by the present invention.

U.S. Pat. Nos. 3,132,963 and 3,945,822 relate to Xerothermography and similar processes. Both employ a photoconductive layer and a silver halide layer and rely on electrophotographic principles.

Figure 2:
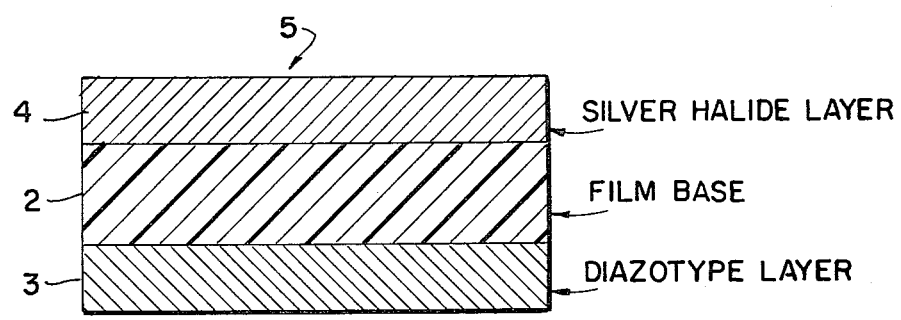
Figure 3:
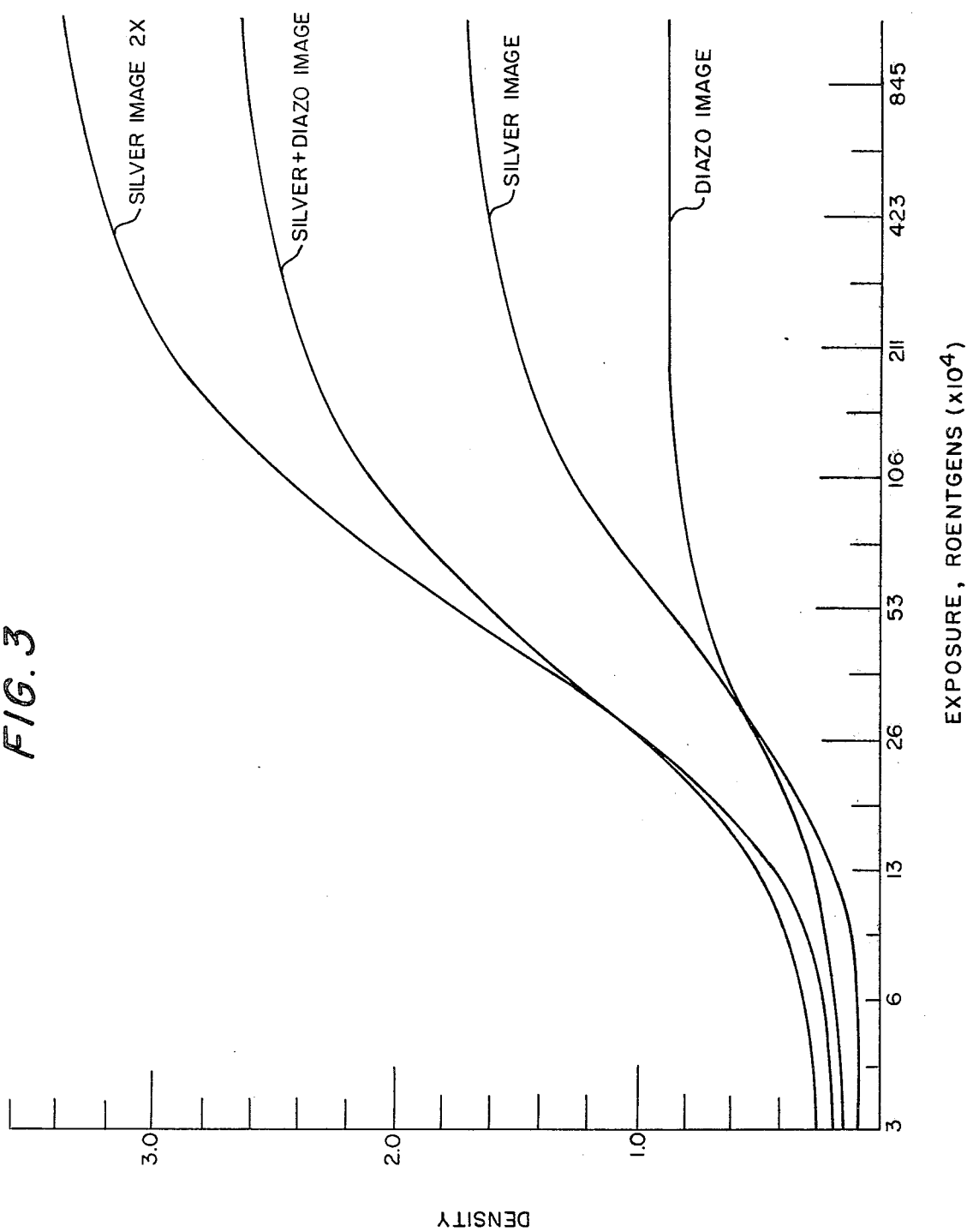

The present invention is illustrated by the accompanying drawings in which:

FIGS. 1 and 2 are schematic views of two embodiments of the photographic recording material of the invention; and FIG. 3 are characteristic curves of prior art products and the product of the invention.

Referring to FIG. 1, a photographic recording material 1 has a transparent film base 2 carrying a photographic silver halide emulsion layer 4 and a layer 3 of a hydrophobic, positive working, near-ultraviolet light-sensitive, one- or two-component diazo composition. FIG. 2 shows an alternative embodiment of the invention in which layers 3 and 4 are on opposite sides of the filmbase 2.

When layer 3 is exposed to actinic radiation through a silver image formed in layer 4, the positive-working diazonium compound is destroyed in exposed areas of layer 3 and, upon development with an alkaline material, forms a positive azo dye image in imagewise non-exposed areas by coupling of the residual diazonium compound and an azo coupler. The azo dye image thus formed in layer 3 will correspond exactly to, and be in registry with, the silver image in layer 4.

FIGS. 1 and 2 illustrate one system according to the invention. While this embodiment employed a positive working diazo material, the non-silver halide photosensitive layer may be a negative-working diazotype composition according to special applications as will be described below, or a vesicular system or a photosensitive polymer. In each system, the principle is the same, namely the formation of an imagewise light-absorbing record in the non-silver layer that will be additive to, and in registry with, the silver image. Exposure, development and fixing of the non-silver image formed in the non-silver halide layer is carried out using techniques known for such systems.

The base carrying the photosensitive layers may be any transparent or translucent photographic base material, such as polyester, e.g. polyethylene terephthalate, polycarbonate, cellulose acetate, cellulose acetate butyrate, cellulose acetate propionate, polystyrene, polyvinyl chloride, polyvinyl acetate and the like.

The present invention finds utility in a wide variety of photographic products, and particularly those that employ a large amount of silver, such as X-ray film. X-ray film employs silver halide layers on both sides of a transparent base, and hence the cost of X-ray film is sensitive to the rising cost of silver.

For industrial X-rays of conventional design, the X-ray radiation passing through X-ray transmitting areas of the object being examined will directly expose the silver halide layer. However, when taking medical X-rays, the X-ray radiation passing through the object is used to excite phosphor-containing intensifying screens on either side of the X-ray film, such as calcium tungstate or rare earth screens, and the silver halide is thus exposed by the X-ray radiation and by the actinic light emitted from the phosphors of the intensifying screens, the X-ray radiation providing 1 to 5% of the exposure with the balance provided by the actinic light from the screens.

An X-ray photographic material of the invention has a silver halide layer and a non-silver halide layer as shown in FIGS. 1 and 2. Generally, the X-ray material will be loaded in a cassette (not shown) as is conventional. In contrast to the conventional use of standard X-ray recording materials, the X-ray material of the invention is preferably exposed with only one intensifying screen in contact with the silver halide emulsion, with the cassette arranged so that the silver halide layer faces the object to be radiographed and the incident X-radiation. After exposure, the latent silver image is developed and stabilized or fixed in a conventional manner to produce a negative silver image in the silver halide emulsion layer. Following this development, the non-silver halide photosensitive layer of the photographic material is exposed to radiation suitably attenuated by the silver image and actinic to the non-silver halide layer. The latent image in the thus exposed non-silver halide layer is developed to form a non-silver positive image in imagewise unexposed areas. The silver and non-silver images cooperate to give a combined image of such density and information capacity as to be suitable for both medical and industrial radiography.

The silver halide layer of the X-ray photographic material of the invention may comprise any light-sensitive silver halide photographic emulsion for an X-ray material, such as a high speed silver iodo-bromide emulsion (1-3 mol % iodide, 97-99 mol % bromide). The silver halide layer is coated over the transparent or translucent base, or over the non-silver halide layer, by any suitable means. Imagewise exposure with X-ray radiation and development and stabilization or fixing of the silver image is also effected using conventional technology and apparatus.

The non-silver halide photosensitive layer is preferably a positive working, diazotype composition, vesicular system, or photosensitive polymer. In each system, the principle will be the same, namely the formation of a positive visible image in the non-silver halide layer that will be additive to, and in registry with, the silver image. Exposure, development and fixing of the positive images formed in the non-silver halide systems will be carried out using techniques known for such systems.

The preferred non-silver halide system is a positive working UV-light-sensitive diazotype composition. Diazotype compositions are known to provide dense azo dye images of high image resolution, and hence are widely used in microfilm. This high resolution is particularly valuable in the present invention, especially for medical X-ray material where high image resolution is an important factor in diagnosis.

Both one-component and two-component diazotype compositions may be used. As is known, in order to reproduce the image as a positive, the diazo compound must be light-sensitive so that it will decompose to a compound no longer capable of forming an azo dye with azo coupling components in those areas which are exposed to light. A diazo compound must also be able to couple under preferably alkaline conditions by simply exposing the diazotype layer containing it to an alkaline environment such as ammonia gas, but at the same time, in the case of two-component systems, having the capability of remaining in a dormant state so that it will not prematurely couple with the azo components. The ability to resist premature coupling may be enhanced by the addition of stabilizing agents to the two-component coating solution used in producing the diazotype layer. The use of stabilizing agents, such as acid stabilizers, endows the two-component diazotype layer with suitable storage stability.

The present invention may make use of such light-sensitive diazonium compounds as are disclosed in U.S. Pat. No. 2,501,874 and in the article by Van der Grinten in the Photographic Journal, vol. 92H, 1952, page 46. Stabilized diazos derived from N-substituted-p-phenylenediamines are most satisfactory. According to the usual practice, these diazos are generally used in the form of salts stabilized with zinc chloride, cadmium chloride and the like.

Azo coupling compounds are also well known in the diazo art and include, but are not limited to, the diazo coupling compounds disclosed at pages 220 to 248 in "Light-Sensitive Systems Chemistry and Application of Non-Silver Halide Photographic Processes"; by Jaromir Kosar, published by John Wiley, New York, Copyright 1965.

Acid stabilizers which are generally employed to prevent the precoupling of the diazonium salt and coupling component include organic acids such as citric acid, tartaric acid, boric acid, acetic acid, etc. as well as inorganic acid such as sulfuric acid, hydrochloric acid, etc. Other additives which are generally included in the light-sensitive diazo layer to prevent precoupling include acidic salts such as zinc chloride, magnesium chloride, cadmium chloride, etc.

When a two-component diazotype composition is used, the azo dye image is developed by contacting the exposed diazotype layer with an alkaline material, such as ammonia gas, as is known in the art. When a one-component diazotype composition is used, the developing agent will contain both an alkaline material and an azo coupling component, as is known.

Where a one-component diazotype composition is used, the diazotype layer cannot undergo premature coupling during development of the silver image, since no azo coupling component is in the diazotype layer. The azo coupler will be supplied during alkaline development of the latent diazo image. Where a two-component system is used, premature coupling is avoided because the hydrophobic diazotype layer does not imbibe sufficient alkaline material during the brief immersion in the aqueous alkaline silver developer to cause any significant diazotype development. However, the latent diazo image is readily developed using ammonia gas or the like.

To insure acceptable image density, it is preferred to use a total amount of silver halide in the range of about 1 to about 15 grams per square meter and an amount of diazonium compound of from about 0.2 to about 0.9 grams per square meter, with the azo coupler being used in an amount at least equimolar to the diazonium compound. The optimum concentrations of the silver halide and non-silver halide layers will be determined empirically, case-by-case for each system.

When the X-ray material, according to the invention, is used for medical X-rays, in most cases only one intensifying screen is employed, and this is placed between the object being X-rayed and the silver halide layer. The use of a backside fluorescent screen may be valuable to achieve shorter exposures of the silver halide layer by light emitted from this screen which must traverse the non-silver halide layer and the filmbase. However, sharpness and resolution of the final image will be significantly lower. Thus, in most cases the use of a backside fluorescent screen is not essential, especially because of the low light sensitivity of diazo compounds and for the stated reasons of loss of image quality.

Another application of the X-ray film of the invention lies in medical radiography in the diagnosis of low contrast subject matter, e.g. in mammography and in the radiography of lungs. Here, highest contrast and highest resolution are required for the detection of the low density differences between cancerous tissue and pulmonary nodules and the surrounding tissue. For such applications, the use of single-side X-ray film with only one front screen has been advocated because its defect detection is superior to the use of a double-side coated film and two intensifying screens. Although the advent of new, more efficient fluorescence screens has overcome the speed loss due to the use of only one-sided X-ray films, contrast is still sacrificed, and thus a loss of information capacity has to be tolerated. This loss of contrast for the radiography of low-contrast subject matter is a serious deficiency in the present state of the art. The use of a single-sided silver halide X-ray film of the present invention in combination with the non-silver halide layer represents a distinct advantage because it (a) significantly increases the contrast so badly needed for the detection of cancerous tissue or of pulmonary nodules, without the use of heavier silver-halide coating, (b) does not increase the patient dosage as compared to that applied in customary single-sided X-ray films, and (c) does not sacrifice resolution, and yields greater information capacity because of its higher contrast than that of a customary single-sided X-ray film.

Still another aspect of the invention is the application in industrial radiography. Here the use of high-energy X- or gamma radiation required for penetrating thick metal parts frequently yield low image contrast because of the low subject contrast. To counteract this, industrial X-ray films often are coated with silver halide emulsion which carry as much as three times the amount of silver as a medical X-ray film to insure an image contrast sufficient for defect detection. Also, if higher resolution is required, single-side coated X-ray films are used. However, this means sacrifice of contrast and thus a sacrifice of information capacity. The image-recording system of the invention, using a front-side silver halide emulsion and positive non-silver halide layer, e.g. a diazo layer, coated either underneath the silver-halide emulsion or on the back-side of the film base, increases the contrast so badly needed in high-energy industrial radiography, without increase in silver content and without loss of speed as compared to that of a customary single-coated X-ray film.

The X-ray photographic material according to the invention is adapted to conventional machine processing. Thus, the photographic material can be developed, after imagewise X-ray radiation exposure, in a continuous processor, e.g. of the type described in U.S. Pat. No. 3,545,971, such as an "X-O-Mat ® Processor". The photographic material carrying the silver image may then be exposed through the silver image and the latent azo dye image developed by means of a conventional diazo processor, such as an Ozalid machine. For sharper images the light source and optical arrangement of the conventional diazo processor may be replaced with an optical arrangement to provide collimated light such as is known in the art. Development time in the X-ray processor and exposure and development times in the diazo processor are determined empirically.

Another aspect of the invention is the use of a silver halide layer and a positive-working non-silver halide layer on a photographic base as a variable-contrast recording medium. It is emphasized that this readily enables a reduction of silver by an amount of some 50% or more for conventional recording films, since the contrast of the combined image can be selected by the degree of exposure of the non-silver halide layer. This is achieved by selecting the actinic exposure level of the non-silver halide positive-working layer, e.g. a diazo layer. At a degree of exposure insufficient to destroy all the diazonium salt in the image area, fog will be high. At increasing exposure levels, the fog level will decrease, the maximum density will remain constant and, therefore, the contrast will increase. However, at increasing degrees of over-exposure of the diazo layer, the maximum density and contrast of the developed image will be decreased. Thus, the contrast will go through a maximum. Therefore, the choice of the exposure for the diazo layer enables a variable contrast image with different degrees of maximum density and contrast without significant change in fog level or background density (except, of course, if the exposure of the positive-working diazo layer were completely omitted and followed by its development).

For some uses, the non-silver halide layer can be a negative working photosensitive material. Thus, using a silver-halide layer on the front-side of the base (i.e. facing the camera lens or the incident radiation for contact printing of an original transparency) and a photosensitive negative-working layer, e.g. a diazo layer, on the backside, it is possible to obtain a recording material for line-records. This product is used as follows. First, a sharply focused silver image is recorded on the silver-halide layer in any conventional manner. After processing, the resulting silver image is exposed with heavily diffused light onto the negative diazo layer. Thus, all sharp density edges in the silver layer will be recorded as unsharp edges. This procedure, particularly if used with a, say, 7 mil thick film base, reduces greatly the macro contrast in the combined image, but enhances the micro contrast of small and large details. Obviously, the resulting image will display a high background density. This, however, is overcome by a high-intensity viewer, known to the art, or by adjusting exposure time if printing of this record is desired. Printing the combined images of the recording system of the invention onto a negative- or a positive-working high contrast recording material (e.g. graphic arts silver halide film, high contrast diazo electrophotographic layers) will yield a line record showing either a white line record on a dark background, or a dark line record on a light background, respectively.

The use of a unit-gamma non-silver halide back layer in combination with its diffuse exposure through the developed silver image displays a uniform background density in the combined image. Thus, only edge contrasts will be displayed. This feature adds considerably to the detection of small details, irrespective of the macro-contrast of surrounding image areas.

The selection of differently colored azo dyes to be formed in the photosensitive diazo layer can result in various color displays. In particular, both single color and multiple color displays can be generated. As for multiple color displays, it is advantageous to select diazos of different "speed" or coupling rates which results in suitable color separation of the individual components. In addition, one or more negative-working diazos may be added to one or more positive-working diazos of different "speed" or coupling rates. This will ensure still better color separation and greater color discrimination. For highly saturated color displays, bleaching of the silver-image subsequent to the diazo development is recommended. An advantage of the availability of a variety of colors lies in the fact that it is known that radiograms may be taken with X-rays of different wavelengths (energies). Thus, monochrome pictures in different colors could be easily produced by taking two or three exposure of the same subject using the films of this invention using different wavelength X-rays. The resulting monochromes could then be superposed to make a single color picture (see "Color X-ray Images and Enhanced Contrast", R.S. Mackay and C.C. Collins, J. Biological Photo Ass'n., 25, No. 3, p. 114-118, August, 1957).

Other applications of this invention will become apparent to those skilled in the art.

The present invention is illustrated by the following Examples. In the specification and appended claims, all parts and proportions are by weight unless otherwise stated.

EXAMPLE 1

Polyester filmbase, 7 mil, was lacquered on one side with a solution containing cellulose acetate butyrate and imbibed with a diazo formulation containing 2,5-dibutoxy-4-morpholino-benzene diazonium chlorozincate and 3,3'-dihydroxy-2-naphthanilide, which give a bright blue color on ammonia development. The opposite side was coated, in sequence, with (1) a priming composition of vinylidene chloride/maleic anhydride and vinyl acetate in a solvent of methyl ethyl ketone and methyl isobutyl ketone, (2) a gelatin-containing subbing layer, (3) a high speed gelatino bromoiodide ammonia-type medical X-ray emulsion of average crystal size, 1.3-1.4 $\mu$m, at 4.3 g silver/m$^2$, and (4) a thin protective gelatin-containing surface layer. This coated material was placed emulsion side up in an aluminum front vacuum cassette with $CaWO_4$ Par-Speed screens, exposed to an X-ray source operated at 65 kv by modulating the beam using a calibrated aluminum stepwedge, processed through an Eastman Kodak M6 ® processing system to obtain a silver image and then, without interim room light exposure, further processed through an Ozalid OM 300 ® diazo copier, silver image side up, at a dial (speed) setting of 35 for the exposure, 10 for the development.

The exposed material was processed in the Ozalid copier as such without recourse to any further protection of the diazo layer. In this fashion a silver stepwedge image was formed on one side of the base with its positive diazo copy on the reverse side. The characteristic curve appears in FIG. 3 designed as the "silver plus diazo image".

A second sample was similarly exposed and the silver image developed, but the diazo latent image was bleached clear with light instead of being processed to a visible image. The characteristic curve of this sample is labeled "silver image" in FIG. 3. A simulated two-sided silver image film was obtained by doubling the density points of the "silver image" curve and its characteristic curve plotted and labeled "silver image 2X" in FIG. 3.

A final sample was treated to give the silver image and diazo image, but the silver halide emulsion layer was removed by enzymatic treatment. The characteristic curve of the resultant diazo image was labeled "diazo image" in FIG. 3.

A tabulation of all sensitometric data is given in Table I. The exposure is expressed in roentgens to give a net density of 1.0. Densitometric measurements were made through a visual (Wrattan 106) filter. Gradation was measured from net density 0.25 to 2.0.

TABLE I

| | Sensitometric Data | | | |
|---|---|---|---|---|
| | Fog | Exposure (r) | Gradation | D-max |
| Silver plus diazo image | 19 | 0.00329 | 1.82 | 2.67 |
| Silver image | 15 | 0.00827 | — | 1.72 |
| Silver image 2X | 27 | 0.00353 | 2.23 | 3.41 |

EXAMPLE 2

Polyester filmbase was coated as in Example 1 to give a material having the diazo layer on one side and a subbed layer on the opposite side suitable for receiving a silver halide emulsion. A low-speed bromoiodide industrial X-ray emulsion of ultrafine grain, average crystal size of 0.3 $\mu$m, was coated at 4.5 g silver/m$^2$ on the subbed side and overcoated with a thin protective gelatin-containing surface layer. The coated material was placed with the silver halide emulsion side up in a cassette and exposed to an X-ray source operated at 65 KV by modulating the beam using a calibrated aluminum stepwedge. Processing was done in "Liquadol" developer for 5 mins. with shortstop and fixation in "Liquafix". Subsequent diazo development was done as in Example 1. In this fashion a silver stepwedge image was formed on one side of the base with its positive blue diazo copy on the reverse side. The sensitometry of this image is referred to as the silver plus diazo image in Table II.

A second sample was similarly treated except that the diazo latent image was bleached clear with light instead of being being processed to a visible image. A simulated two-sided silver image film was obtained by doubling the density points of the silver image and the resulting sensitometry referred to as silver image 2X in Table II. The exposure is expressed in roentgens to give a net density of 1.5, the gradation is measured from net density 1.5-2.5. A comparison was made with a two-sided GAF 100 industrial X-ray control coating.

TABLE II

| | Sensitometric Data | | |
|---|---|---|---|
| | Fog | Exposure (r) | Gradation |
| Silver plus diazo image | 11 | 1.94 | 4.45 |
| Silver image 2X | 9 | 1.81 | 3.09 |
| GAF 100 Industrial X-ray image | 15 | 1.81 | 4.37 |

EXAMPLE 3

A number of strips of the X-ray product prepared in Example 1 were placed emulsion side up in an aluminum front vacuum cassette with $CaWO_4$ Par-Speed screens, exposed to an X-ray source operating at 65 KV through a calibrated aluminum stepwedge and processed in an Eastman Kodak M6 ® processing system to obtain the same silver image on each strip. Single strips were fed through the exposure section of an Ozalid OM300 ® diazo copier with the silver image side up at differing transport speeds as controlled by the dial settings on the copier. All strips were put through the ammonia development section at a dial setting of 10. The fog level remained unchanged over the 10-30 setting range but increased to 0.38 over the 40-60 setting range. Gradation went through a distinct maximum at a setting of 20, somewhat higher than the silver image 2X. Shoulder density was essentially maximized at a setting of 20.

EXAMPLE 4

Polyester filmbase, 7 mil, was lacquered on one side with a cellulose acetate butyrate-containing solution and imbibed with the diazo composition of Example 1. This layer was subsequently overcoated with (1) a gelatin-containing subbing layer, (2) a high speed bromoiodide ammonia-type medical X-ray emulsion at 5.5 g silver/m$^2$ and (3) a 1.3 μm protective gelatin-containing surface layer.

The X-ray material was exposed and developed as in Example 1 with similar results.

What is claimed is:

1. A method for producing a radiograph which comprises providing a photographic element, having a photographic base carrying a light-sensitive photographic silver halide emulsion layer and a photosensitive non-silver halide layer in operative association with said silver halide layer, said non-silver halide layer being light-sensitive positive working diazotype composition with form azo dyes and the steps of imagewise exposure of said photographic element to x-ray radiation; development of the element to form a silver image; imagewise exposure of said non-silver halide layer through the silver image; and development of the non-silver halide layer to form a non-silver image corresponding to and in registry with silver image.

2. The method of claim 1, wherein the silver halide and non-silver halide layers are provided on opposite sides of the base.

3. The method according to claim 1, wherein the layers are on the same side of the base, with the silver halide layer being over said non-silver halide layer.

4. The method according to claim 1, wherein said base is a transparent or translucent material selected from the group consisting of polyester, polycarbonate, cellulose acetate, cellulose acetate butyrate, cellulose acetate propionate, polystyrene, polyvinyl chloride and polyvinyl acetate.

* * * * *